(12) United States Patent
Ootake

(10) Patent No.: US 8,384,175 B2
(45) Date of Patent: Feb. 26, 2013

(54) METHOD FOR MANUFACTURING SOLID STATE IMAGING DEVICE AND SOLID STATE IMAGING DEVICE

(75) Inventor: Hajime Ootake, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/225,907

(22) Filed: Sep. 6, 2011

(65) Prior Publication Data

US 2012/0146169 A1    Jun. 14, 2012

(30) Foreign Application Priority Data

Dec. 10, 2010   (JP) .................... 2010-275541

(51) Int. Cl.
 *H01L 31/0232* (2006.01)
(52) U.S. Cl. .............. 257/432; 250/208.1; 250/216; 250/226; 257/E31.127; 257/440; 359/620; 359/642; 438/69; 438/70; 438/73
(58) Field of Classification Search ............... 250/208.1, 250/216, 226; 257/E31.127, 432, 440; 359/620, 359/642; 438/69, 70, 73
See application file for complete search history.

(56) References Cited

U.S. PATENT DOCUMENTS

| | | | | |
|---|---|---|---|---|
| 6,157,017 | A | * | 12/2000 | Kim ...................... 250/208.1 |
| 7,307,788 | B2 | | 12/2007 | Boettiger et al. |
| 2005/0133688 | A1 | * | 6/2005 | Li et al. ................... 250/208.1 |
| 2011/0018080 | A1 | | 1/2011 | Ootake |

FOREIGN PATENT DOCUMENTS

| | | |
|---|---|---|
| JP | 2009-272422 | 11/2009 |
| WO | WO 2006/060298 A2 | 6/2006 |
| WO | WO 2006/060298 A3 | 6/2006 |

OTHER PUBLICATIONS

U.S. Appl. No. 13/050,530, filed Mar. 17, 2011, Hajime Ootake.

* cited by examiner

*Primary Examiner* — Asok K Sarkar
(74) *Attorney, Agent, or Firm* — Oblon, Spivak, McClelland, Maier & Neustadt, L.L.P.

(57) ABSTRACT

Certain embodiments provide a method for manufacturing a solid state imaging device, the method including: forming a plurality of first semispherical lens bodies; forming a second transparent resin layer; and forming a second lens body. The plurality of first semispherical lens bodies are respectively formed on a plurality of photodiode layers formed on a principal surface of a semiconductor substrate. The second transparent resin layer is a resin layer having an etching rate higher than that of the first lens body, and is formed so that the semiconductor substrate including the plurality of first lens bodies is covered with the second transparent resin layer. The second lens bodies are formed on a surface except the top part of each of the first lens bodies by etching an entire surface of the second transparent resin layer until top parts of the first lens bodies are exposed.

18 Claims, 9 Drawing Sheets

(a)

(b)

(c)

METHOD FOR MANUFACTURING SOLID STATE IMAGING DEVICE AND SOLID STATE IMAGING DEVICE

CROSS REFERENCE TO RELATED APPLICATIONS

This application is based upon and claims the benefit of priority from the prior Japanese Patent Application No. 2010-275541 filed in Japan on Dec. 10, 2010; the entire contents of which are incorporated herein by reference.

FIELD

Embodiments described herein relate generally to a method for manufacturing a solid state imaging device and a solid state imaging device.

BACKGROUND

A conventional solid state imaging device has a plurality of photodiodes formed on a semiconductor substrate, and a plurality of microlenses respectively formed on the photodiodes. The photodiodes and the microlenses constitute pixels.

A conventional method for manufacturing a solid state imaging device is as follows. First, a lens material is uniformly applied on photodiodes. Next, the lens material is exposed and developed to form block-shaped lens bodies every other pixel. Next, the block-shaped lens bodies are melted by heat to be formed in a semispherical shape. The semispherical lens bodies are then cooled and cured, thereby forming first microlenses. Second microlenses are then similarly formed so as to fill a space between the first microlenses.

In the conventional method for manufacturing a solid state imaging device, no gap is formed between the first microlens and the second microlens, and the first and second microlenses are formed in a semispherical shape having a desired curvature. Thus, a solid state imaging device is manufactured, which has a plurality of microlenses having a contiguous spherical shape and has high sensitivity.

However, conventionally, it is necessary to repeat a step of forming microlenses twice in order to form the solid state imaging device having high sensitivity. Therefore, the conventional method for manufacturing a solid state imaging device disadvantageously has a long manufacturing time.

Furthermore, the above-mentioned manufacturing method requires a photomask for forming block-shaped lens bodies for the first microlenses and a photomask for forming block-shaped lens bodies for the second microlenses. Therefore, a cost required to manufacture the solid state imaging device also has increased.

DETAILED DESCRIPTION

A method for manufacturing a solid state imaging device according to one embodiment includes: forming a first transparent resin layer; forming block-shaped lens bodies; forming a plurality of first semispherical lens bodies; forming a second transparent resin layer; and forming a second lens body. The first transparent resin layer is formed on a principal surface of a semiconductor substrate having a plurality of photodiode layers. The block-shaped lens bodies are respectively formed on the photodiode layers so that the block-shaped lens bodies are separated from each other. These block-shaped lens bodies are formed by exposing and developing the first transparent resin layer using a photomask. The plurality of first semispherical lens bodies are formed so that the first semispherical lens bodies are separated from each other by melting the plurality of block-shaped lens bodies by heat. The second transparent resin layer has an etching rate higher than that of the first transparent resin layer, and is formed so that the semiconductor substrate including the plurality of first lens bodies is covered with the second transparent resin layer. The second lens body is formed on surfaces except top parts of the first lens bodies by etching the entire surface of the second transparent resin layer until the top parts of the first lens bodies are exposed.

A solid state imaging device according to one embodiment includes a semiconductor substrate, a plurality of first semispherical lens bodies, and a plurality of second lens bodies. The semiconductor substrate has a plurality of photodiode layers formed thereon. The plurality of first semispherical lens bodies are respectively formed on the plurality of photodiode layers formed on a principal surface of the semiconductor substrate. The plurality of second lens bodies are respectively formed on the surfaces except the top parts of the plurality of first lens bodies.

Hereinafter, the solid state imaging device according to the above-mentioned embodiment and the method for manufacturing the same will be described in detail with reference to the drawings.

(First Embodiment)

Figure 1:
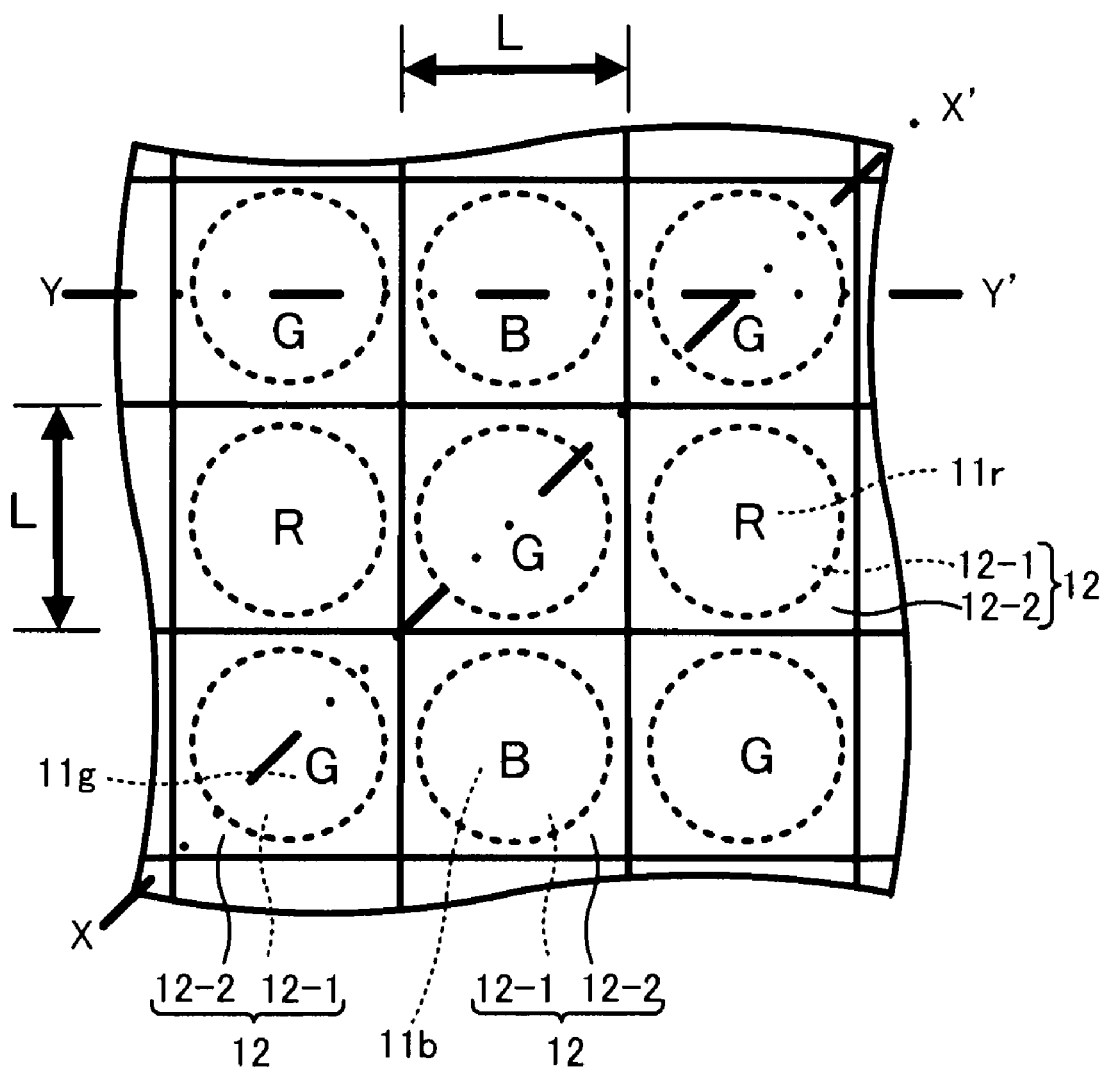
FIG. 1 is a top view showing an essential part of a solid state imaging device manufactured by a method for manufacturing a solid state imaging device according to a first embodiment.
Figure 2:
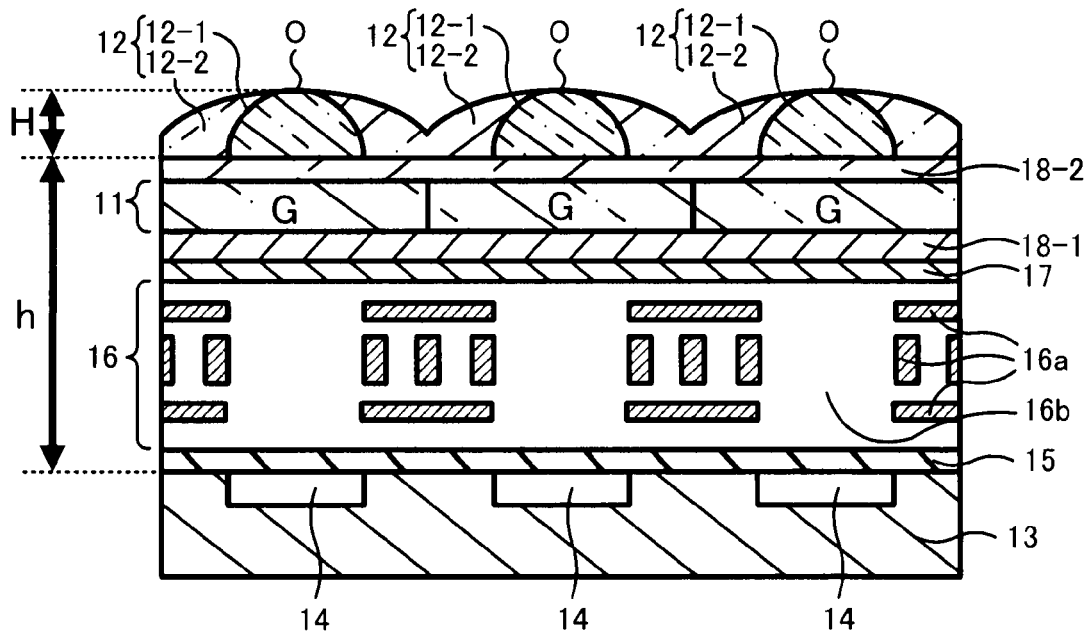
FIG. 2 is a sectional view of an essential part of the device taken along a dashed-two dotted line X-X' of FIG. 1.
Figure 3:
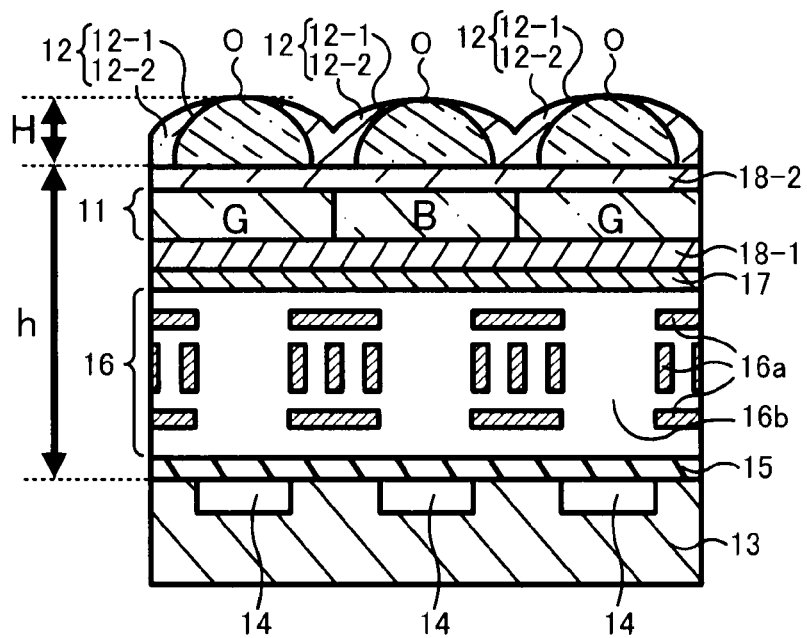
FIG. 3 is a sectional view of an essential part of the device taken along a dashed-two dotted line Y-Y' of FIG. 1.

FIG. 1 is a top view showing an essential part of a solid state imaging device manufactured by a method for manufacturing a solid state imaging device according to a first embodiment. FIG. 2 is a sectional view of an essential part of the device taken along a dashed-two dotted line X-X' of FIG. 1, and FIG. 3 is a sectional view of an essential part of the device taken along a dashed-two dotted line Y-Y' of FIG. 1. Reference character R shown in FIGS. 1, 2 and 3 represents a red color filter layer 11r in which a transmission band is a red wavelength band. Reference character B represents a blue color filter layer 11b in which a transmission band is a blue wavelength band. Reference character G represents a green color filter layer 11g in which a transmission band is a green wavelength band. The meanings of the reference characters R, G and B are the same also in the subsequent figures.

As shown in FIG. 1, the solid state imaging device has a plurality of contiguous spherical microlenses 12 arranged and formed without gap on a color filter layer 11. The color filter layer 11 is obtained by Bayer-arranging the blue color filter layer 11b, the red color filter layer 11r and the green color filter layer 11g in a lattice form.

Each of the microlenses 12 is a hybrid microlens which includes a circular first lens body 12-1 and a square second lens body 12-2 having an etching rate higher than that of the first lens body 12-1 and a refractive index higher than that of the first lens body 12-1.

The first lens body 12-1 showing a circular shape in FIG. 1 actually has a semispherical shape as shown in FIGS. 2 and 3. The first lens body 12-1 is made of a lens material having an etching rate of about 0.5 μm/min and a refractive index of about 1.6, for example.

As shown in FIGS. 2 and 3, the second lens body 12-2 showing a square shape in FIG. 1 is actually formed so that a surface except a partial area including a top part O of the first lens body 12-1 is covered with the second lens body 12-2. The second lens body 12-2 is made of a microlens material having an etching rate of about 1.0 μm/min and a refractive index of about 1.7, for example.

Thus, each of the hybrid microlenses 12 including the first lens body 12-1 and the second lens body 12-2 is disposed on the blue color filter layer 11b, the red color filter layer 11r or the green color filter layer 11g. The plurality of microlenses 12 are formed so that the microlenses 12 are brought into contact with each other, and thereby the plurality of microlenses 12 have a contiguous spherical shape.

As shown in FIGS. 2 and 3, the solid state imaging device including the above-mentioned microlenses 12 and the color filter layers 11r, 11b and 11g is a so-called surface irradiation type solid state imaging device. The surface irradiation type solid state imaging device has, as a principal surface, a surface of a semiconductor substrate 13 made of, for example, silicon. A color filter layer 11 including the blue color filter layer 11b, the red color filter layer 11r and the green color filter layer 11g, and a plurality of contiguous spherical microlenses 12 including a semispherical first lens bodies 12-1 and a second lens body 12-2 are formed on the surface, that is, the principal surface of the semiconductor substrate 13.

A plurality of photodiode layers 14 are formed on the principal surface, that is, the surface of semiconductor substrate 13. The plurality of photodiode layers 14 are arranged and formed in a lattice form depending on the arrangement of the color filter layers 11r, 11b and 11g.

A wiring layer 16 is formed on the principal surface of the semiconductor substrate 13, with an oxide film 15 having a uniform thickness interposed therebetween. The wiring layer 16 includes a plurality of wires 16a formed in layers, and an insulating layer 16b formed between the wires 16a to insulate the wires 16a from each other. The wires 16a include a read-out gate for transmitting electric charges photoelectrically converted in the photodiode layers 14 to a floating diffusion part (not shown) for converting the electric charges into a voltage.

A passivation film 17 (surface protection film 17) and a first planarizing layer 18-1 are formed on the surface of the wiring layer 16 in this order. Furthermore, a color filter layer 11 including the blue color filter layer 11b, the red color filter layer 11r and the green color filter layer 11g is formed on a flat surface of the first planarizing layer 18-1.

A second planarizing layer 18-2 is formed on the surface of the color filter layer 11. A plurality of upward convex microlenses 12 are formed on the surface of the planarizing layer 18-2. As described above, each of the microlenses 12 includes the semispherical first lens body 12-1 and the second lens body 12-2.

Unlike nonreflecting coating formed so that the surface of the first semispherical lens body 12-1 is covered with the nonreflecting coating having a uniform film thickness by a method such as sputter, the second lens body 12-2 itself also has a role of condensing light.

Each of the microlenses 12 is formed so as to have a desired height (H) and a desired curvature (C). Herein, the desired height (H) and the desired curvature (C) are values previously calculated so that light is most condensed on the photodiode layers 14 depending on a pixel (cell) size (L×L) (FIG. 1), refractive indexes of the first and second lens bodies (n1, n2), and a distance (h) between the upper surface of the second planarizing layer 18-2 and the upper surface of the photodiode layer 14.

The height (H) of the microlens 12 is determined by the height of the first semispherical lens body 12-1. The curvature (C) of the microlens 12 is determined by a ratio of an etching rate of the second lens body 12-2 to an etching rate of the first lens body 12-1.

In the above-mentioned solid state imaging device, a pixel is formed by the photodiode layer 14, any one of the blue color filter layer 11b, the red color filter layer 11r and the green color filter layer 11g, and the microlens 12. Such a plurality of pixels are arranged and formed in a lattice form.

Next, a method for manufacturing the solid state imaging device described above will be described with reference to FIGS. 4 to 19. FIGS. 4, 7, 10, 13 and show a top view for explaining a method for manufacturing the solid state imaging device according to the first embodiment, and corresponding to FIG. 1. FIGS. 5, 8, 11, 14 and 17 show a sectional view of an essential part of the device taken along a dashed-two dotted line X-X' of FIGS. 4, 7, 10, 13 and 16. FIGS. 6, 9, 12, 15 and 18 show a sectional view of an essential part of the device taken along a dashed-two dotted line Y-Y' of FIGS. 4, 7, 10, 13 and 16.

First, an oxide film 15, a wiring layer 16, passivation film 17 and a first planarizing layer 18-1 are sequentially formed on a principal surface (surface) of a semiconductor substrate 13 in which a plurality of photodiode layers 14 are arranged and formed in a lattice form. A color filter layer 11 is then formed on the surface of the first planarizing layer 18-1. The color filter layer 11 includes a blue color filter layer 11b, a red color filter layer 11r and a green color filter layer 11g which are Bayer-arranged and formed in a lattice form so as to correspond to the lattice arrangement of the photodiode layers 14. A general manufacturing method may be appropriately applied to the above-mentioned manufacturing method.

Figure 4:
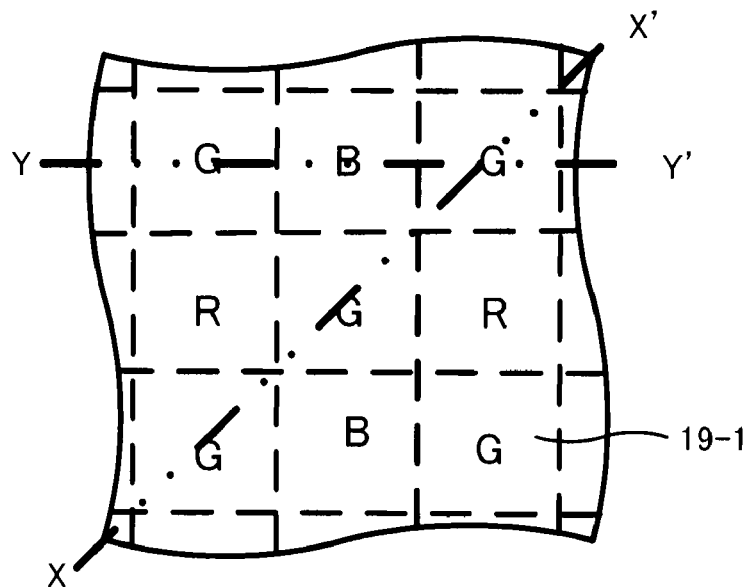
FIG. 4 is an illustration for explaining the method for manufacturing the solid state imaging device of FIG. 1, and is a top view showing the step of forming a first transparent resin layer on a color filter layer and corresponding to FIG. 1.
Figure 5:
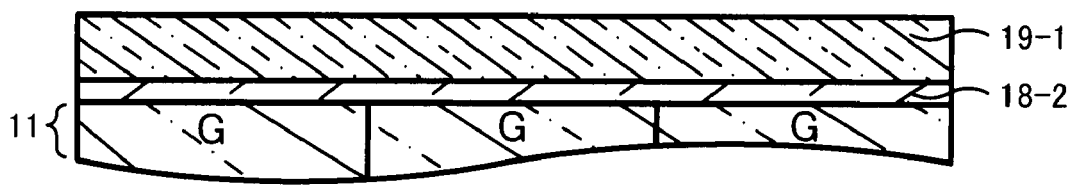
FIG. 5 is a sectional view of an essential part of the device taken along a dashed-two dotted line X-X' of FIG. 4.
Figure 6:
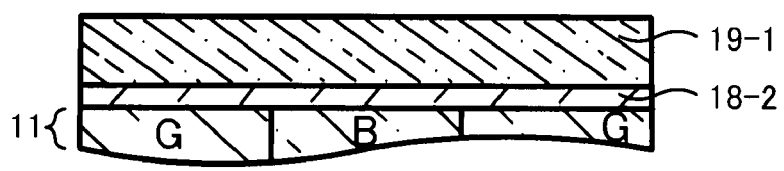
FIG. 6 is a sectional view of an essential part of the device taken along a dashed-two dotted line Y-Y' of FIG. 4.

As shown in FIGS. 4 to 6, a second planarizing layer 18-2 is then formed on the surface of the color filter layer 11. Subsequently, a first transparent resin layer 19-1 having photosensitivity and heat flowability is formed on the surface of the second planarizing layer 18-2. The first transparent resin layer 19-1 serves as first semispherical lens bodies 12-1 afterward. As the first transparent resin layer 19-1, for example, a lens material having an etching rate of about 0.5 μm/min and a refractive index of about 1.6 is applied.

Figure 7:
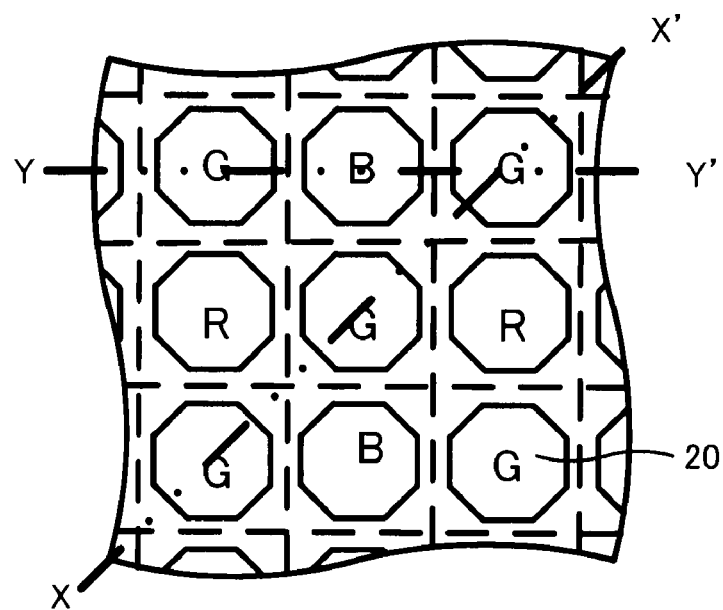
FIG. 7 is an illustration for explaining the method for manufacturing the solid state imaging device of FIG. 1, and is a top view showing the step of forming block-shaped lens bodies and corresponding to FIG. 1.
Figure 8:
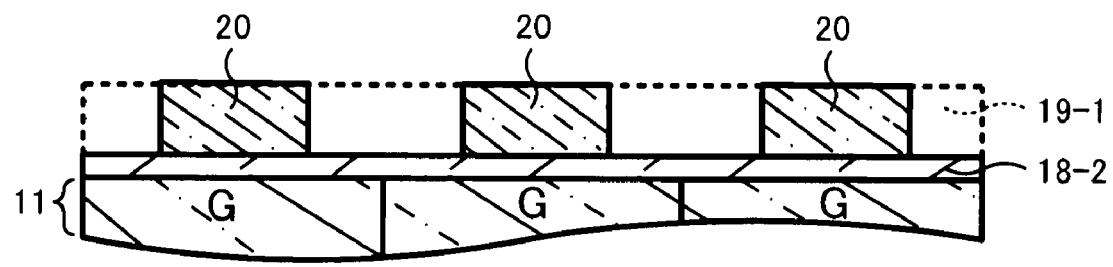
FIG. 8 is a sectional view of an essential part of the device taken along a dashed-two dotted line X-X' of FIG. 7.
Figure 9:
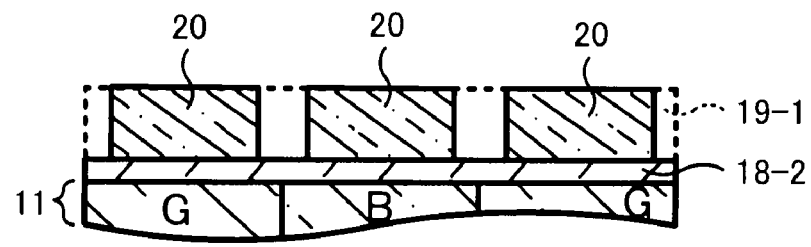
FIG. 9 is a sectional view of an essential part of the device taken along a dashed-two dotted line Y-Y' of FIG. 7.

Next, as shown in FIGS. 7 to 9, the first transparent resin layer 19-1 is exposed and developed using a photomask (not shown), to respectively form block-shaped lens bodies 20 on the color filter layers 11r, 11b, 11g.

When each of the block-shaped lens bodies 20 is melted by heat afterward, each of the block-shaped lens bodies 20 is formed at a degree of dimension capable of avoiding contact with the other adjacent melted block-shaped lens body 20 (first semispherical lens body 12-1).

For example, as shown in FIG. 7, the block-shaped lens body 20 has an octagon shape. However, the shape of the lens body 20 is not limited thereto. When the lens body 20 has a shape close to a circular shape, the lens body 20 can be easily formed in a semispherical shape in the following step.

Figure 10:
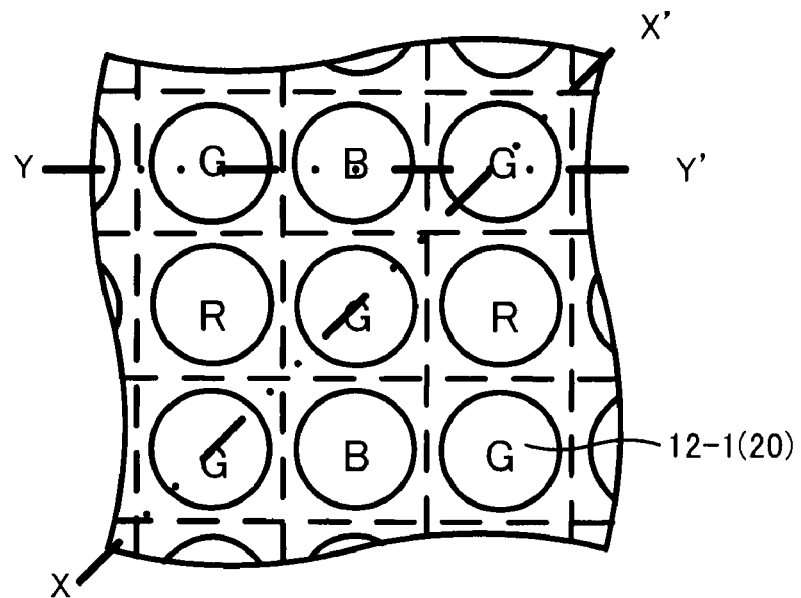
FIG. 10 is an illustration for explaining the method for manufacturing the solid state imaging device of FIG. 1, and is a top view showing the step of forming first semispherical lens bodies and corresponding to FIG. 1.
Figure 11:
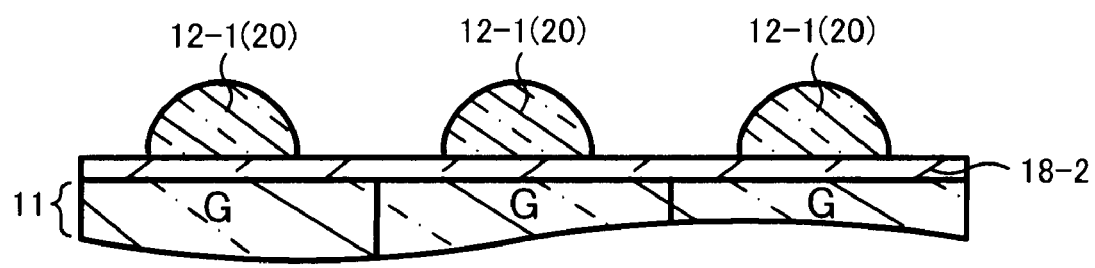
FIG. 11 is a sectional view of an essential part of the device taken along a dashed-two dotted line X-X' of FIG. 10.
Figure 12:
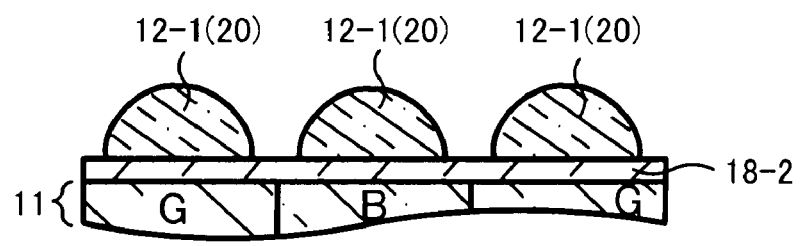
FIG. 12 is a sectional view of an essential part of the device taken along a dashed-two dotted line Y-Y' of FIG. 10.

Next, as shown in FIGS. 10 to 12, after each of the block-shaped lens bodies 20 is melted by heat, and formed in the semispherical shape, each of the block-shaped lens bodies 20 is cooled and cured, thereby forming the first semispherical lens body 12-1. After each of the block-shaped lens bodies 20 is formed in the semispherical shape, each of the block-shaped lens bodies 20 may be further post-exposed if needed, thereby further curing each of the block-shaped lens bodies 20. The plurality of first semispherical lens bodies 12-1 thus formed are separated from each other.

The first semispherical lens body 12-1 formed in the step is formed so that a height thereof substantially coincides with a height (H) (FIGS. 2, 3) of a microlens previously designed.

Figure 13:
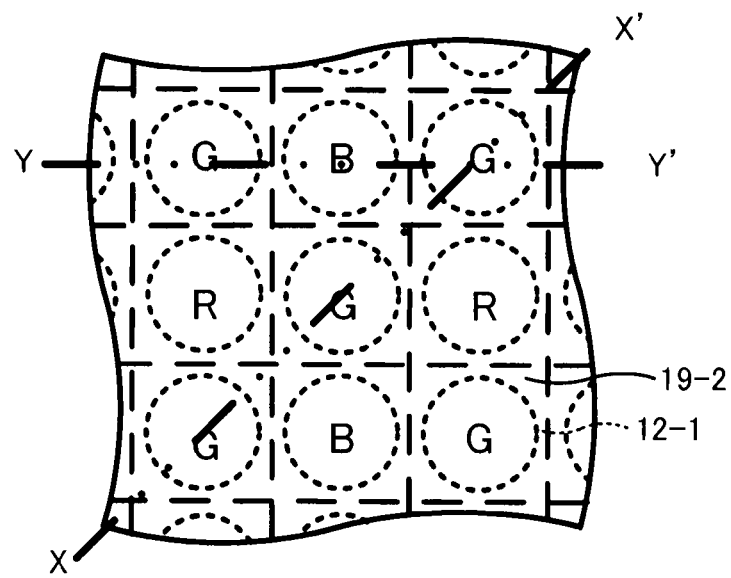
FIG. 13 is an illustration for explaining the method for manufacturing the solid state imaging device of FIG. 1, and is a top view showing the step of forming a second transparent resin layer on a color filter layer including first semispherical lens bodies and corresponding to FIG. 1.
Figure 14:
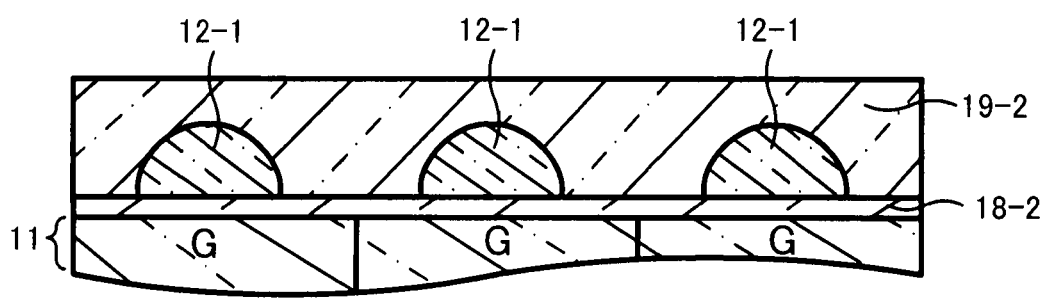
FIG. 14 is a sectional view of an essential part of the device taken along a dashed-two dotted line X-X' of FIG. 13.
Figure 15:
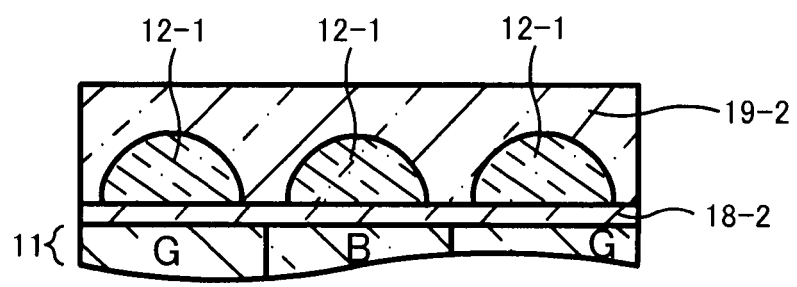
FIG. 15 is a sectional view of an essential part of the device taken along a dashed-two dotted line Y-Y' of FIG. 13.

Next, as shown in FIGS. 13 to 15, a second transparent resin layer 19-2 is formed so that a surface of the second planarizing layer 18-2 including the plurality of first semispherical lens bodies 12-1 is covered with the second transparent resin layer 19-2. The second transparent resin layer 19-2 serves as the second lens body 12-2 of the microlens 12 in the following step. As the second transparent resin layer 19-2, a material having an etching rate higher than that of the first transparent resin layer 19-1 and a refractive index higher than that of the first transparent resin layer 19-1 is applied. Specifically, as the second transparent resin layer 19-2, for example, a lens material having an etching rate of about 1.0 μm/min and a refractive index of about 1.7 is applied.

Figure 16:
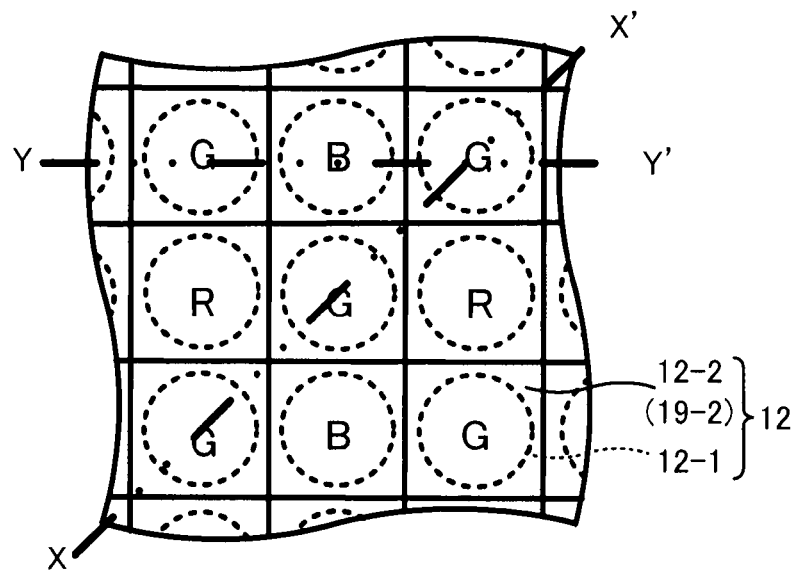
FIG. 16 is an illustration for explaining the method for manufacturing the solid state imaging device of FIG. 1, and is a top view showing the step of etching the entire surface of the second transparent resin layer and corresponding to FIG. 1.
Figure 17:
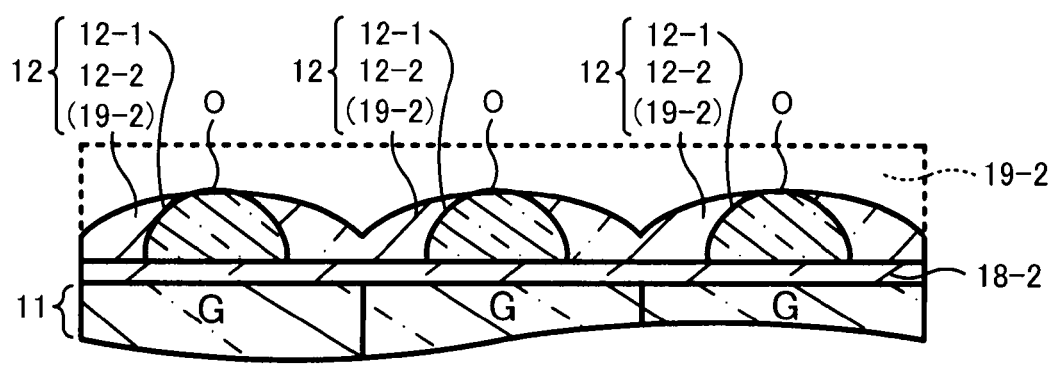
FIG. 17 is a sectional view of an essential part of the device taken along a dashed-two dotted line X-X' of FIG. 16.
Figure 18:
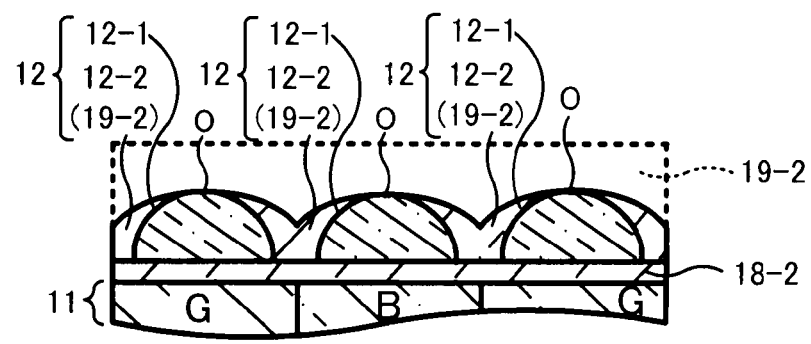
FIG. 18 is a sectional view of an essential part of the device taken along a dashed-two dotted line Y-Y' of FIG. 16.

Next, as shown in FIGS. 16 to 18, the entire surface of the second transparent resin layer 19-2 is etched until a partial area including a top part O of the first semispherical lens body 12-1 is exposed. Thereby, a plurality of contiguous spherical microlenses 12 including the first semispherical lens bodies 12-1 and the second lens body 12-2 are formed. Examples of etching methods include dry etching such as reactive ion etching (RIE).

Figure 19:
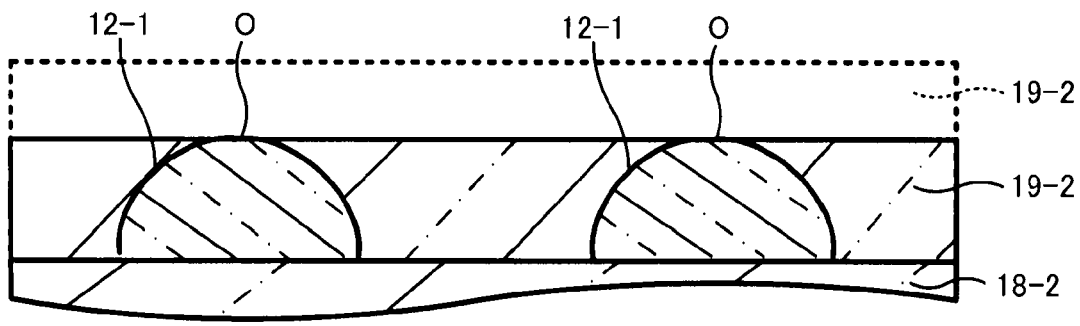
FIG. 19 is a view showing the etching step for forming microlenses, and is a sectional view corresponding to a part of FIG. 17.
Figure 19:
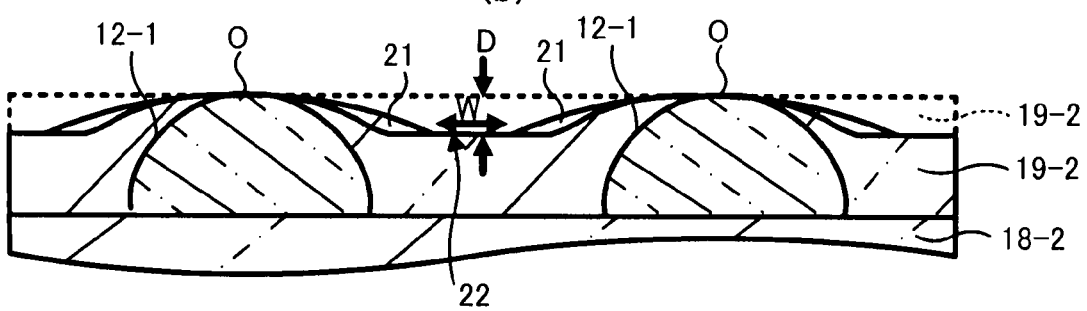
Figure 19:
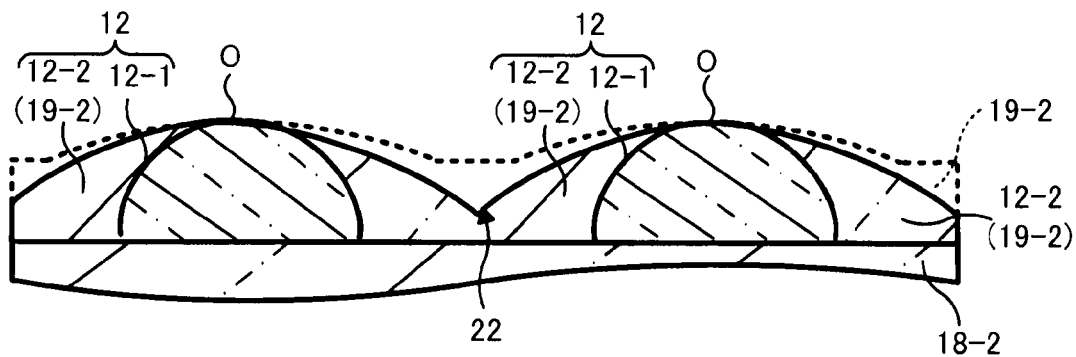

Herein, the etching step will be described in detail with reference to FIG. 19. FIG. 19 is a view showing the etching step for forming the microlenses 12, and is a sectional view corresponding to a part of FIG. 17. In the following description, the etching step will be described with reference to FIG. 19 corresponding to a section shown in FIG. 17. Etching advances as in FIG. 19 also in a section shown in FIG. 18.

In the etching step shown in FIGS. 16 to 18, until just before the top part O of the first semispherical lens body 12-1 is exposed, the second transparent resin layer 19-2 is uniformly etched (FIG. 19(*a*)).

However, when the etching advances, and the top parts O of the first lens bodies 12-1 begin to be exposed, the second transparent resin layer 19-2 formed between the first lens bodies 12-1 is deeply etched while the top parts O of the first lens bodies 12-1 are slightly etched (FIG. 19(*b*)). This is because the etching rate of the second transparent resin layer 19-2 is higher than that of the first lens body 12-1.

In the etching step, as shown in FIG. 19(*b*), some reaction products 21 produced when the second transparent resin layer 19-2 is etched adhere to side surfaces of a concave part 22 formed by etching between the first lens bodies 12-1. Therefore, with the advance of the etching, a width W of the concave part 22 formed by the etching becomes narrower, and a depth D of the concave part 22 becomes deeper. Since the etching rate of the first lens body 12-1 is lower than that of the second lens body 12-2 in this case, the first lens body 12-1 is not substantially etched even when the etching advances so that the concave part 22 becomes narrower and deeper as described above. Therefore, the microlens 12 does not have a cushion shape (trapezoid shape having a flat top part). As shown in FIG. 19(*c*), the second lens body 12-2 formed by the second transparent resin layer 19-2 having a film thickness gradually increased toward a circumferential direction from the top part O of the first semispherical lens body 12-1 is formed on the surface except the partial area including the top part O of the first semispherical lens body 12-1. Thus, the microlenses 12 including the first lens bodies 12-1 and the second lens body 12-2 are formed.

When the top part O of the first lens body 12-1 is not removed in the etching step, the surface of the formed microlens 12 is brought to a spherical surface. Therefore, the etching rate of the first transparent resin layer 19-1 serving as the material of the first lens body 12-1 is preferably lower than that of the second transparent resin layer 19-2.

As described above, according to the method for manufacturing the solid state imaging device according to the embodiment, a plurality of contiguous spherical microlenses 12 can be collectively formed without conventionally repeating the forming step of microlenses a plurality of times. Therefore, the manufacturing time of the method for manufacturing the solid state imaging device according to the embodiment can be made shorter than that of the conventional method.

According to the method for manufacturing the solid state imaging device according to the embodiment, the number of the photomasks required when forming the block-shaped lens body 20 can be reduced. Therefore, in the method for manuembodiment, a cost required to manufacture the solid state imaging device can be made lower than that of the conventional method.

According to the solid state imaging device according to the embodiment thus manufactured, the microlens 12 includes two kinds of materials (first lens body 12-1 and second lens body 12-2). The second lens body 12-2 has a refractive index higher than that of the first lens body 12-1. Therefore, light entered into the microlens 12 is refracted on the surface of the first lens body 12-1, and is further refracted on the boundary surface between the first lens body 12-1 and the second lens body 12-2. Therefore, the focus of the light condensed in the microlens 12 becomes closer to the microlens 12 as compared with a microlens made of a single material. Accordingly, the solid state imaging device according to the embodiment can shorten a distance h between the microlens 12 and the photodiode layer as compared with the conventional solid state imaging device having the microlens made of the single material. Consequently, the solid state imaging device according to the embodiment is made thinner than the conventional solid state imaging device.

According to the solid state imaging device according to the embodiment manufactured as described above, the plurality of microlenses 12 having a desired height (H) and curvature (C) are formed in the contiguous spherical shape. The light entered into the solid state imaging device is refracted twice in the microlenses, and reaches the photodiode layer 14. Therefore, the solid state imaging device according to the embodiment has a desired height (H) and curvature (C), and the entered light can be efficiently condensed on the photodiode layer 14 as compared with the conventional solid state imaging device in which the plurality of microlenses made of the single material are formed in the contiguous spherical shape. Consequently, sensitivity of the solid state imaging device according to the embodiment can be higher than that of the conventional solid state imaging device.

(Second Embodiment)

Figure 20:
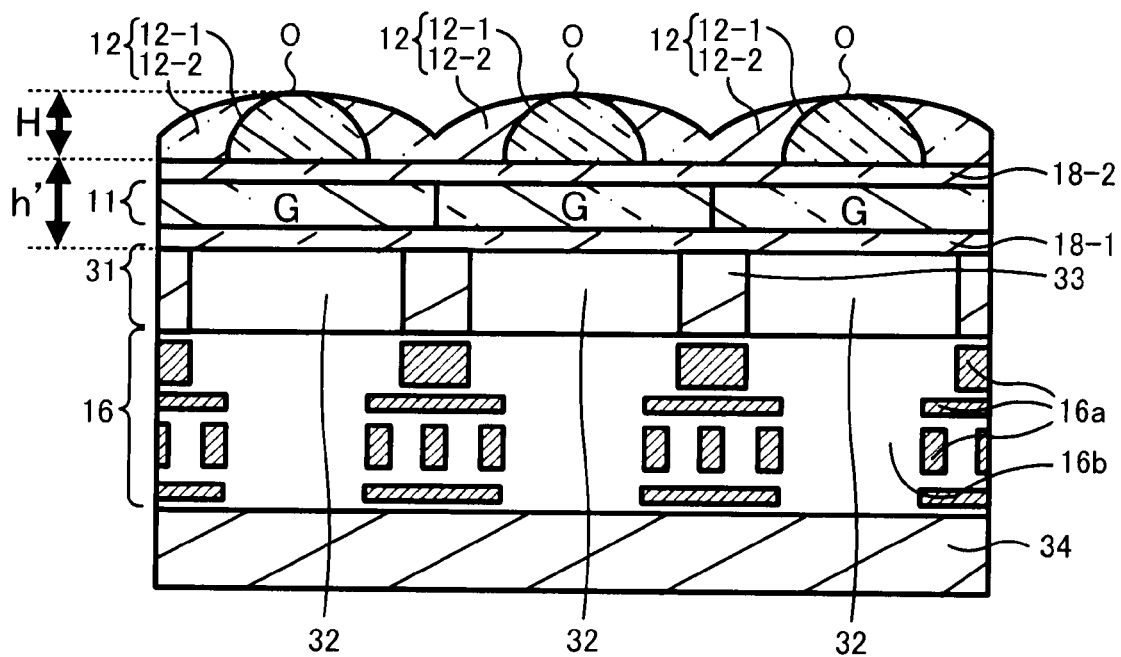
FIG. 20 is a sectional view showing an essential part of a solid state imaging device manufactured by a method for manufacturing a solid state imaging device according to a second embodiment and corresponding to FIG. 2.
Figure 21:
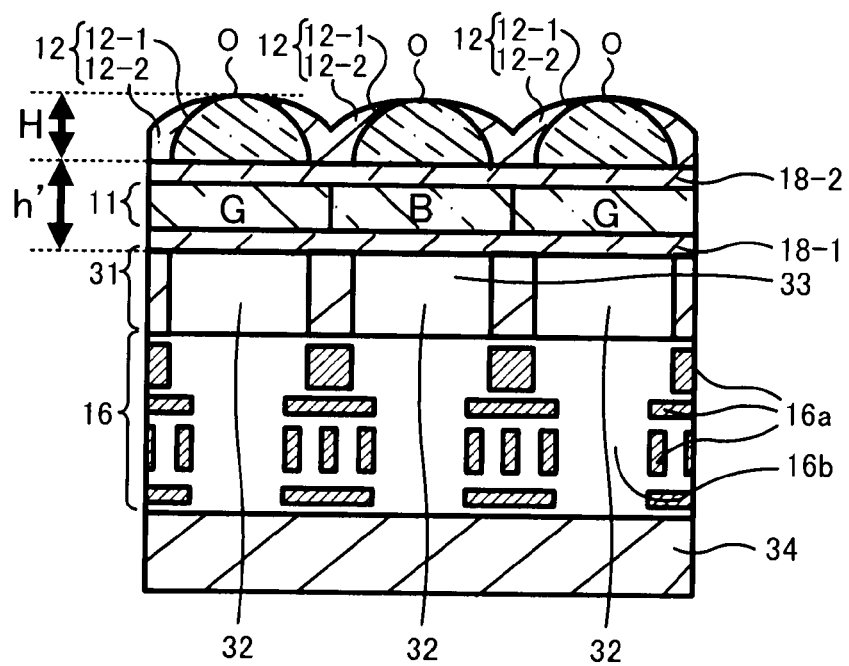
FIG. 21 is a sectional view showing an essential part of the solid state imaging device manufactured by the method for manufacturing the solid state imaging device according to the second embodiment and corresponding to FIG. 3.

FIG. 20 is a sectional view showing an essential part of a solid state imaging device manufactured by a method for manufacturing a solid state imaging device according to a second embodiment and corresponding to FIG. 2. FIG. 21 is a sectional view showing the essential part of the solid state imaging device manufactured by the method for manufacturing the solid state imaging device according to the second embodiment and corresponding to FIG. 3. In the description of the solid state imaging device manufactured by the method for manufacturing the solid state imaging device, only portions different from those of the solid state imaging device manufactured by the method for manufacturing the solid state imaging device according to the first embodiment are described. The same portions are designated by like reference numerals, and the description thereof is omitted. Although the method for manufacturing the solid state imaging device is different from the method according to the first embodiment except for the method for manufacturing a plurality of contiguous spherical microlenses 12, the method for manufacturing the plurality of contiguous spherical microlenses 12 is the same as that of the first embodiment. Therefore, the description of the manufacturing method is omitted.

The solid state imaging device shown in FIGS. 20 and 21 is a so-called back face irradiation type solid state imaging device. The back face irradiation type solid state imaging device has, as a principal surface, a back face of a semiconductor substrate 31 made of, for example, silicon. A color filter layer 11 including a blue color filter layer 11b, a red color filter layer 11r and a green color filter layer 11g, and a plurality of contiguous spherical microlenses 12 including a semispherical first lens bodies 12-1 and a second lens body 12-2 are formed on the back face, that is, the principal surface of the semiconductor substrate 31.

A plurality of photodiode layers 32 are arranged and formed in a lattice form in the semiconductor substrate 31 so as to penetrate the semiconductor substrate 31. A pixel separation layer 33 is formed between the photodiode layers 32.

A wiring layer 16 is formed on the surface of the semiconductor substrate 31. A first planarizing layer 18-1, a color filter layer 11 and a second planarizing layer 18-2 are laminated and formed in this order on the back face of the semiconductor substrate 31. A plurality of contiguous spherical microlenses 12 are formed on the surface of the second planarizing layer 18-2.

As described above, even the method for manufacturing the solid state imaging device according to the embodiment can collectively form the plurality of contiguous spherical microlenses 12, and the plurality of photomasks are not required when forming the plurality of microlenses 12. Therefore, the manufacturing time can be made shorter than that of the conventional method as in the method for manufacturing the solid state imaging device according to the first embodiment. The cost required to manufacture the solid state imaging device can be further reduced.

Even the back face irradiation type solid state imaging device according to the embodiment thus manufactured includes the microlenses 12 made of two kinds of materials (first semispherical lens body 12-1 and second lens body 12-2), and the second lens body 12-2 has a refractive index higher than that of the first lens body 12-1. Therefore, the solid state imaging device according to the embodiment can be made thinner than the conventional solid state imaging device having the plurality of microlenses made of the single material, and the sensitivity thereof can be improved.

Furthermore, the back face irradiation type solid state imaging device according to the embodiment receives the light from the side opposite to the wiring layer 16. Therefore, since the wires 16a in the wiring layer 16 can be easily designed, the wiring layer 16 can be made thin. Consequently, the back face irradiation type solid state imaging device according to the embodiment is made thinner as compared with the surface irradiation type solid state imaging device according to the first embodiment.

Furthermore, the back face irradiation type solid state imaging device according to the embodiment condenses the light entered through the microlenses 12 on the photodiode layers 32 without passing through the wiring layer 16. Therefore, the sensitivity of the back face irradiation type solid state imaging device according to the embodiment can be further improved as compared with the surface irradiation type solid state imaging device according to the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the method for manufacturing the solid state imaging device according to the embodiments of the present invention, the plurality of microlenses 12 are formed in the contiguous spherical shape. However, the plurality of microlenses 12 may be formed so that microlenses 12 are separated from each other. In this case, the first semispherical lens bodies 12-1 may be formed smaller than those of the above-mentioned embodiments, and the etching time of the second transparent resin layer 19-2 may be lengthened.

In the method for manufacturing the solid state imaging device according to the embodiments of the present invention, all of the first semispherical lens bodies 12-1 have an equal height. However, the first lens bodies 12-1 may have different heights. In this case, the microlenses 12 to be finally formed also have different heights.

The method for manufacturing the solid state imaging device according to the embodiments of the present invention can be applied also in a method for manufacturing a solid state imaging device having the microlenses and having any kind of structure. For example, the method can be applied also to a solid state imaging device having no color filter layer.

What is claimed is:

1. A method for manufacturing a solid state imaging device, the method comprising:

forming a first transparent resin layer above a principal surface of a semiconductor substrate having a plurality of photodiode layers;

exposing and developing the first transparent resin layer using a photomask, to respectively form block-shaped lens bodies above the photodiode layers so that the block-shaped lens bodies are separated from each other;

melting the plurality of block-shaped lens bodies by heat, to form a plurality of first semispherical lens bodies so that first semispherical lens bodies are separated from each other;

forming a second transparent resin layer having an etching rate higher than that of the first transparent resin layer so that the second transparent resin layer covers surfaces of the first lens bodies and fills between the first lens bodies; and etching an entire surface of the second transparent resin layer until top parts of the first lens bodies are exposed, to form a plurality of second lens bodies formed from the second transparent resin layer, each of the second lens bodies extending between the first lens bodies, and contacting a surface of the first lens body, wherein the top part of each of the first lens bodies is exposed from the second lens body.

2. The method for manufacturing a solid state imaging device according to claim 1, wherein the second transparent resin layer is a material having a refractive index higher than that of the first transparent resin layer.

3. The method for manufacturing a solid state imaging device according to claim 1, wherein the second transparent resin layer is etched so that a gap is not formed between a plurality of microlenses including the first lens bodies and the second lens bodies.

4. The method for manufacturing a solid state imaging device according to claim 1, wherein the second lens body is formed so that a film thickness of the second lens body is gradually increased toward a circumferential direction from the top part of the first lens body.

5. The method for manufacturing a solid state imaging device according to claim 1, wherein the etching is reactive ion etching.

6. The method for manufacturing a solid state imaging device according to claim 1, wherein the block-shaped lens body has an octagonal horizontal sectional shape.

7. The method for manufacturing a solid state imaging device according to claim 1, wherein a height and curvature of the microlens including the first lens body and the second lens body are designed so that light with which a surface of the microlens is irradiated is most efficiently condensed on the photodiode layer.

8. The method for manufacturing a solid state imaging device according to claim 7, wherein the height and curvature of the microlens are designed depending on a size of a pixel including the microlens and the photodiode layer, a refractive index of the first lens body, a refractive index of the second lens body, and a distance between the microlens and the photodiode layer.

9. The method for manufacturing a solid state imaging device according to claim 8, wherein the microlens has a height substantially coinciding with a height of the first lens body.

10. The method for manufacturing a solid state imaging device according to claim 8, wherein the curvature of the microlens is determined by a ratio of an etching rate of the first transparent resin layer and an etching rate of the second transparent resin layer.

11. A solid state imaging device comprising:

a semiconductor substrate having a plurality of photodiode layers formed thereon;

a plurality of first semispherical lens bodies respectively formed above the plurality of photodiode layers; and a plurality of second lens bodies formed above the semiconductor substrate, each of the second lens bodies extending between the first lens bodies, contacting a surface of the first lens body, and being made of material having a refractive index higher than that of the first lens bodies, wherein a top part of each of the first lens bodies is exposed from the second lens body.

12. The solid state imaging device according to claim 11, wherein a plurality of microlenses including the first lens bodies and the second lens bodies have a contiguous spherical shape.

13. The solid state imaging device according to claim 11, wherein a film thickness of the second lens body is gradually made thicker toward a circumferential direction from the top part of the first lens body.

14. The solid state imaging device according to claim 11, wherein the microlens including the first lens body and the second lens body has a height and curvature capable of most efficiently condensing light with which a surface of the microlens is irradiated, on the photodiode layer.

15. The solid state imaging device according to claim 14, wherein the microlens has a height and curvature designed depending on a size of a pixel including the microlens and the photodiode layer, a refractive index of the first lens body, a refractive index of the second lens body, and a distance between the microlens and the photodiode layer.

16. The solid state imaging device according to claim 15, wherein the microlens has a height substantially coinciding with a height of the first lens body.

17. The solid state imaging device according to claim 11, wherein the first lens bodies are formed above an upper surface of the semiconductor substrate.

18. The solid state imaging device according to claim 11, wherein the first lens bodies are formed above a back surface of the semiconductor substrate.

* * * * *